United States Patent [19]

Vermillion

[11] Patent Number: 5,637,377
[45] Date of Patent: Jun. 10, 1997

[54] PROTECTIVE CONTAINERBOARD FOR ELECTROSTATIC DISCHARGE SENSITIVE DEVICES

[75] Inventor: Bob Vermillion, Alhambra, Calif.

[73] Assignee: Sunclipse, Inc., Buena Park, Calif.

[21] Appl. No.: 456,180

[22] Filed: May 31, 1995

[51] Int. Cl.⁶ .................................................. B32B 3/28
[52] U.S. Cl. ........................ 428/182; 428/184; 428/206;
428/207; 428/209; 428/211; 156/277; 156/314;
206/709
[58] Field of Search .............................. 428/182, 184,
428/206, 207, 209, 24; 156/60, 277, 176,
290, 314; 206/709

[56] References Cited

U.S. PATENT DOCUMENTS

| | | | |
|---|---|---|---|
| 4,289,513 | 9/1981 | Bronnhill et al. | 428/182 |
| 4,888,242 | 12/1989 | Matsuo et al. | 428/182 |
| 5,126,112 | 6/1992 | Burgie | 428/182 |
| 5,310,593 | 5/1994 | Tsujimoto et al. | 428/182 |

*Primary Examiner*—Donald Loney
*Attorney, Agent, or Firm*—Beehler & Pavitt

[57] ABSTRACT

Currugated sheeting for enclosing electrostatically sensitive devices in the form of an undulating sheet medium presenting alternating fluting apexes on opposite sides of the sheet medium, the medium being impregnated with an electrical resistivity of 10,000 ohms per square or less, and a kraft paper liner covering adhered to the fluting apexes on each side of the medium.

33 Claims, 1 Drawing Sheet

PROTECTIVE CONTAINERBOARD FOR ELECTROSTATIC DISCHARGE SENSITIVE DEVICES

FIELD OF THE INVENTION

This invention relates generally to the field of protective packaging for electronic devices sensitive to electrostatic discharge and more particularly relates to improved paperboard sheeting for use in such packaging and a method for making the improved paperboard sheeting.

BACKGROUND OF THE INVENTION

Description of the Prior Art

Static electricity, more formally known as triboelectric charge, builds up naturally in many materials, for example as a result of simple friction between two dissimilar materials. The build up of static electricity is strongest in electrically insulative materials, as such materials hinder the flow and dissipation of the charge. Accumulated electrostatic charge discharges occur when a conductive path is established to an electrical ground. The conductive path may be nothing more than the surrounding air provided that the relative humidity is sufficiently high, and this is the reason why static charge seldom builds up in humid climates. On the other hand, very dry air acts as an insulator and inhibits the natural discharge of static electricity.

Modern electronic circuits make use of certain types of semiconductor devices, including integrated circuits and transistors, which can be irreparably damaged by even the briefest exposure to a minute electrostatic field or electrostatic discharge. Electrostatic damage to an electronic device is not visible or otherwise apparent, and typically is not discovered until the device is placed into operation, usually as part of a circuit board or other higher assembly. Consequently, unless the devices are individually tested, damaged devices or even entire circuit boards may not be discovered until they have been assembled into a system; therefore rendering the device inoperative and resulting in costly wasted time, labor and materials.

Because of this susceptibility, extreme caution must be taken at all stages of handling of such devices. Electrostatically sensitive devices must be protected at all times and at every step along the chain of industrial processing and commercial distribution up to their final installation in an end user system. This includes in-plant movement of the devices between different workstations as well as transport of the devices from an initial manufacturing site to a geographically removed assembly facility or some other commercial distribution point.

Considerable effort has been directed to the development of packaging materials capable of protecting the delicate electronic devices against damage by electrostatic discharge. This effort has been primarily directed towards improving the electrical conductivity of packaging material, specifically, the manufacture of electrically conductive papers and paperboards made from cellulosic pulp. The conductive sheet material is cut into single-piece blanks which are then folded along predetermined fold lines to make boxes, envelopes or other packaging. The one-piece construction of the packaging results in a continuous enclosure of electrically conductive material around the static-sensitive electronic devices.

Two primary approaches to the making of conductive packaging have been developed: impregnation of the paper material with a conductive substance, and coating or printing of the paper material with an electrically conductive ink. Depending on the degree of electrical conductivity of the resulting sheet materials they are classified, insofar as their anti-static properties, as either electrically conductive or electrostatically dissipative. Conductive materials are generally those having an electrical surface resistivity equal to or less than $10^4$ Ohms (ten thousand Ohms) per square, while dissipative materials have an electrical surface resistivity in the range of $10^6$ Ohms and $10^{12}$ Ohms per square (ASTMD-257-78). Conductive materials readily discharge static electricity and consequently prevent the build up of electrostatic charges. On the other hand, because of their superior conductivity, these materials can discharge accumulated static electricity so rapidly as to induce sparking, as for example, when a container of conductive material is touched in dry weather and a small spark jumps between hand and container. Sparking is potentially harmful to sensitive electronic devices even when the spark never touches the electronic device. The spark creates an electric field which in turn can induce damaging electrical charges in nearby electronic devices. It is therefore necessary not only to keep the electronic devices away from contact with any materials carrying an electro-static charge, but also to avoid exposure of the devices to the electric field of a nearby spark discharge.

Protection against electrostatic charge is normally provided by enclosing sensitive electronic devices and circuits in an electrically conductive enclosure. This arrangement is known in physics as a Faraday cage, which acts as an effective barrier against electrostatic charges. Static electricity may build up on the conductive enclosure, but does not penetrate the interior of the enclosure. However, the electronic devices are vulnerable to damage if sparking occurs between the container and a ground path while the container is open. Under such circumstances the open container does not completely shield the devices against the effects of electrical fields induced by the spark. While sparking from a closed conductive container to a ground path such as a person's hand cannot harm a sensitive device contained in the closed package, the electronic device can be damaged or destroyed if the same sparking occurs while the container happens to be open. The sparking problem can be avoided by use of electrostatically dissipative packaging materials which, because of their greater electrical resistivity, have a slower rate of discharge of the static build up. However, the Faraday shielding effect of dissipative materials is inferior to that of conductive materials.

Because of the above, considerable effort has been expended towards developing low-cost packaging materials, specifically papers and paperboards, which can be shaped into various types of boxes, envelopes and other containers, yet provide the protective Faraday cage effect to shield the contents against electrostatic charges. It is particularly desirable to make such conductive paper materials which are also recyclable, as very often such packaging is seldom reused. For example, U.S. Pat. Nos. 4,711,702 to Hood and 5,205,406 to Bradford describe processes for impregnating paper pulp with electrically conductive carbon black for making antistatic paperboard used in box containers and cartons for protecting electrostatic discharge sensitive devices. U.S. Pat. Nos. 4,160,503; 4,293,070 and 4,211,324, all issued to Ohlbach describe paperboard containers coated on inside surfaces with conductive carbon black to prevent an outside static electricity charge from reaching the sensitive contents. These efforts have produced packaging materials which are primarily electrically conductive in nature, and therefore offer less than complete protection of the contents because the possibility of sparking has not been eliminated.

Limited efforts have also been made to combine the advantages of each type of packaging material so as to provide full Faraday shielding while at the same time minimizing the risk of sparking. U.S. Pat. No. 4,000,790 issued to Youngs et al. describes a multi-ply fiberboard structure which includes one or more plies impregnated with a conductive material such as carbon black. The fiberboard is a sandwich structure made of multiple plies or layers which are pressed together to make a single thickness of the fiberboard. Conductive plies and unimpregnated plies may be assembled in various combinations. For example, a conductive ply may be placed between unimpregnated plies, which may be electrically dissipative due to the natural properties of the paper material. The result is a conductive layer buried between dissipative layers. Sheets of this multiply board can then be assembled to make corrugated board. For example, the multi-ply paperboard may be used as the inner and/or outer facing of a corrugated paperboard, in which the fluted medium or inner layer is typically made of kraft paperboard medium.

This arrangement suffers from the shortcoming common to containers made of fiberboard made conductive by impregnation with carbon black, namely, a susceptibility to sparking when the carbon material is closely adjacent to either the inner or outer surface of the paperboard. In a multi-ply board where the conductive ply is buried between non-conductive plies, conductive carbon material may be exposed at fold lines where the outer non-conductive plies may break open. Furthermore, such materials are susceptible to shedding of conductive carbon particles, either by migration through the nonconductive plies or at open fold lines. Such conductive particles can bridge closely adjacent conductors on electronic devices or circuit boards in the packaging and cause a destructive short circuit when the device is placed into service. Such particles are typically too small to see before irreparable damage has been done to the electronic device. This is referred to as latent defect.

What is needed is a paper or fiberboard material, particularly a corrugated fiberboard having adequate strength and rigidity for use in making packaging such as cartons, boxes, envelopes and other containers for electrostatically sensitive electronic devices, which provides Faraday cage type shielding against electrical fields and static discharges, which is safe against sparking, and which is also secure against shedding of conductive particles onto the contents of the package. It is further desirable that the improved packaging be available in large commercial quantity with uniform electrostatic properties and protective between $10^7$ Ohms and $10^{11}$ Ohms/square at a relative humidity greater than 10 percent. In a presently preferred form of the invention, the electrical resistivity of the kraft liner is between $10^7$ Ohms and $10^{10}$ Ohms at a relative humidity greater than 10 percent. Furthermore, it is desirable that the kraft liner have a static charge drain rate from 5 Kilovolt to 500 Volts in less than 2 seconds.

In a preferred form of the invention, the kraft liners each have an outer surface facing away from the corrugated medium, which outer surface may be coated with an electrically dissipative sealer. The dissipative sealer may include a dissipative ink and a sealant varnish such as a styrene acrylic polymer varnish. The dissipative ink may be applied in admixture with the sealer varnish to the kraft liner, and then covered by an outer protective coating of the varnish alone. Preferably, the dissipative ink is blue colored, which color is generally accepted in the industry as indicative of electrostatically dissipative material.

The present invention also contemplates a method for making commercial quantities of recyclable protective sheeting for use in packaging electrostatically sensitive devices, which sheeting has a high degree of uniformity of its static dissipative properties. The novel method comprises the steps of providing a carbon impregnated corrugated medium in continuous roll form, the corrugated medium having an electrical resistivity lesser than $10^4$ Ohms per square, characteristics. It is also desirable to provide such a static-safe fiberboard which is resistant to changes in relative humidity so as to maintain more uniform static dissipating properties in different environment. Additionally, it is highly desirable that the protective packaging should be recyclable by processes ordinarily used for the recycling of conventional non-conductive cardboards and papers.

SUMMARY OF THE INVENTION

The present invention addresses the aforementioned need by providing corrugated sheeting for enclosing electrostatically sensitive devices, which sheeting has an undulating sheet medium presenting alternating fluting apexes on opposite first and second sides. The medium is sufficiently impregnated with an electrically conductive material to impart to the medium an electrical resistivity equal to or lesser than approximately $10^4$ Ohms (ten thousand Ohms) per square. First and second kraft liner coverings are adhered to the fluting apexes on the first and second opposite sides of the medium, respectively. It is preferred to impregnate the medium with carbon as the electrically conductive material. Desirably, the medium is a cellulose paper material containing no less than about 7.5 percent by weight of the electrically conductive material. For example, the medium may be a kraft paper having a powered carbon black content of no less than about 225 pounds per 3000 pound batch of kraft paper pulp. The kraft liner desirably has an electrical resistivity of providing kraft paper liner in continuous roll form, preprinting one surface of the kraft paper liner with an electrostatically dissipative ink, and applying in continuous roll form the preprinted kraft liner paper to each side of the medium by adhering an unprinted opposite surface of the kraft liner paper to the apexes of the corrugations of the medium. The preprinting step may comprise the step of applying a protective coating over the coating of dissipative ink. The preprinting step may further comprise printing the one surface of the kraft liner first with one or more bumps of the dissipative ink and then with one or more additional bumps of protective varnish over the ink. A base coating of dissipative ink may be applied in admixture with a styrene acrylic polymer varnish and a 10% admixture of carbon ink, followed by application of one or more additional bumps of the dissipative ink in admixture with the styrene acrylic polymer varnish. Finally one or more layers or bumps of protective varnish may be applied. The carbon ink may have finely ground carbon black admixed with water and a resin such as styrene acrylic polymer.

These and other features, advantages and improvements of the present invention will be better understood from the following detailed description of the preferred embodiments taken in conjunction with the accompanying drawings.

DETAILED DESCRIPTION OF THE PREFERRED EMBODIMENTS

Figure 1:
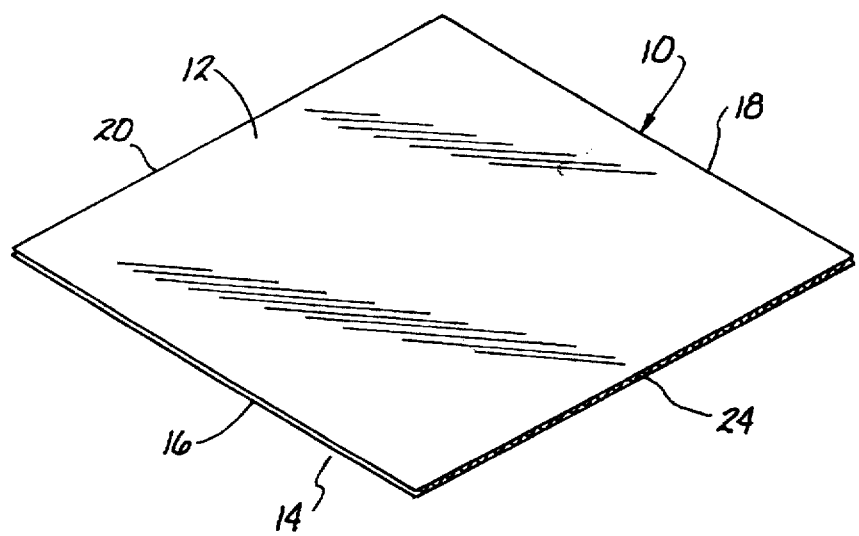
FIG. 1 is a perspective view of a rectangular piece of electrostatically protective sheeting made according to this invention.

With reference to the drawings, FIG. 1 shows a rectangular piece, generally designated by the numeral 10, of protective containerboard made according to this invention. The containerboard piece 10 has an upper surface 12, and an opposite undersurface 14 which is hidden from view in FIG. 1. The piece 10 also has two opposite longitudinal edges 16, 18 and two transverse edges 20, 24.

Figure 2:
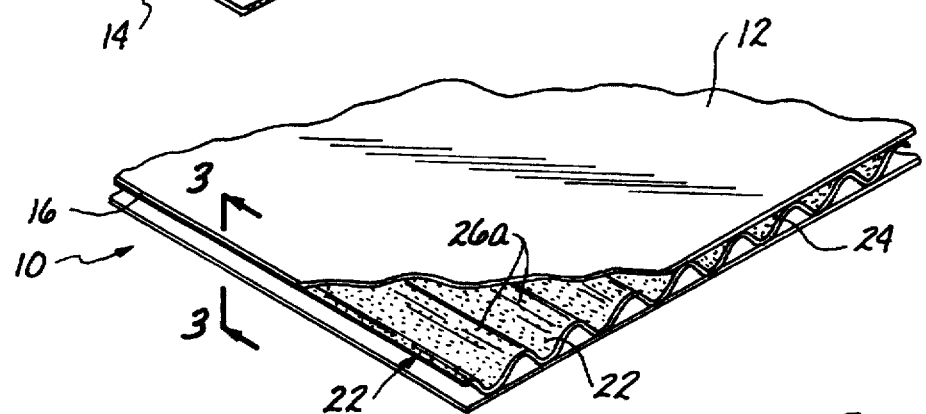
FIG. 2 is an enlarged perspective view of a corner of the sheeting of FIG. 1 partially broken away to show the conductive corrugated medium between the kraft liner coverings.
Figure 3A:
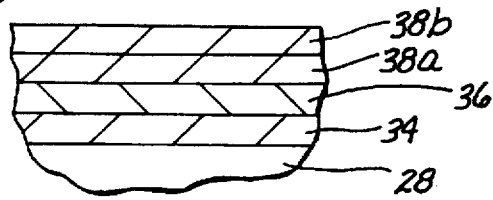
FIG. 3a is an enlarged detail view of the fragment designated by the numeral 3a in FIG. 3.
Figure 3:
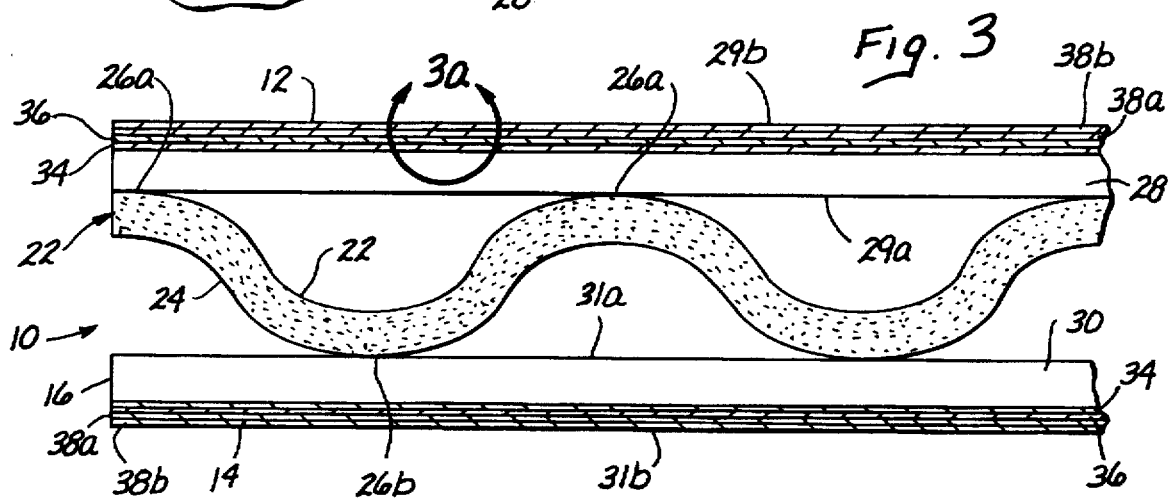
FIG. 3 is an enlarged fragmentary cross-sectional view of the sheeting of FIG. 1.

Turning now to FIGS. 2 and 3, it is seen that the containerboard panel 10 has a corrugated medium 22 made of an undulating sheet having opposite first and second sides 22, 24 respectively, presenting alternating fluting apexes 26a, 26b respectively. The fluting apexes run parallel to the longitudinal edges 16, 18 and perpendicular to the transverse edges 22, 24.

A first kraft liner covering 28 has an inner side 29a adhesively attached, by means of a conventional cornstarch adhesive, to the apexes 26a on one side of the corrugated medium 22, and a second kraft liner covering 30 has an inner side 31a similarly affixed to the fluting apexes 26b of the opposite side of the corrugated medium, as best understood by reference to FIG. 3.

The corrugated conductive medium 22 preferably has a weight of 30 lbs/1000 sq.ft., although satisfactory results have been obtained in the weight range of 26–33 lbs/1000 sq.ft. This weight is somewhat heavier than conventionally employed in ordinary corrugated cardboards, where the weight of the corrugated medium most commonly is 26 lbs/1000 sq.ft. The kraft paper liners 28, 30 may range in weight from 26 to 90 lbs/1000 sq.ft. For ordinary corrugated cardboard the most commonly encountered weight for the inner and outer kraft liners is 42 lbs/1000 sq.ft., with 69 lbs/1000 sq.ft. liners being used for heavier duty material.

Each kraft liner covering 28, 30 has an outer surface 29b, 31b respectively facing away from the medium 22. In a presently preferred form of the invention, the outer surfaces 29b, 31b of the kraft liner coverings are both coated with an electrically dissipative sealer which is made up of a base coat 34 of dissipative ink, a second coat 36 of dissipative ink and two additional layers or bumps 38a, 38b of protective varnish over the ink coating.

The corrugated medium 22 is made of kraft paper impregnated with carbon black powder to impart to the medium an electrical resistivity approximately equal or lesser than $10^4$ Ohms per square. This can be achieved by admixing approximately 20 to 30 percent by weight of powdered carbon black to kraft paper pulp in the manufacture of the corrugated medium 22. The kraft liner coverings 28, 30 are of conventional manufacture and weight.

The ink layer 34 is applied to the kraft liner at 2 pounds per 1,000 square feet of kraft liner and is best applied in a so-called double bump in a continuous process printing machine. The base coating or first bump of ink 34 is composed of approximately 1.4% finely powdered metallic copper and 69% titanium dioxide admixed in 13.5% styrene acrylic polymer, 10% carbon ink, and the balance being made up of pigments, waxes and other additives as are conventional and appropriate in the industry for such ink.

The composition of the carbon ink is:

| | |
|---|---|
| 25% | finely ground granulated carbon black e.g. CD 6002 Beads - CAS No. 1333-86-4 Pigment Black 7 sold by Columbian Chemicals Co., Atlanta, Georgia |
| 50% | water |
| 15% | acrylic resin such as styrene acrylic polymer |
| 10% | industry conventional additives |

The preferred color of the ink pigmentation is blue, which has become accepted as a de facto standard coloring in the electronics industry for static-dissipative materials. The second ink layer 36 is applied in the composition given above but without the carbon ink admixture as the second bump (with additional styrene acrylic resin replacing the carbon ink). The two ink layers 34,36 are then covered by application of an additional double bump 38a, 38b of styrene acrylic polymer resin as a protective varnish.

According to the method of this invention, both the ink layers 34, 36 and the protective varnish layers 38a,38b are applied to the kraft liners 28, 30 in a preprinting process before the kraft liners are assembled to the corrugated medium 22. The kraft liner is preprinted in large continuous rolls in a conventional high speed continuous roll printing machine. All four bumps, i.e. two bumps of the ink layers 34,36 and two bumps of the varnish layers 38a,38b, may be applied in a single pass of the kraft liner roll through such a printing machine. The preprinted kraft liner is then assembled to the conductive corrugated medium 22 to make the containerboard structure of FIGS. 1 through 3.

In an alternate form of this invention, a more economical version of the static-protective containerboard can be made by dispensing with the ink and varnish layers 34, 36, 38a,38b and simply applying plain unprinted conventional kraft liner coverings 28, 30 to the electrically conductive impregnated corrugated medium 22. Plain kraft liner has naturally inherent static dissipative properties with an electrical resistivity which typically is within the general range of $10^9$–$10^{12}$ Ohms per square and a charge decay rate of less than 2 seconds as measured according to the industry standard test Mil-B-81705 for charge decay. A two second charge decay period is the usual minimum standard required of commercially acceptable static-dissipative packaging materials. However, the static dissipative performance of plain kraft liner suffers somewhat under conditions of very low humidity, i.e. below about 10% relative humidity. Under such circumstances, the static dissipative properties of the kraft liner are somewhat reduced. However, such low relative humidity is rarely encountered in most climates relevant to the electronics manufacturing industry, and this more economical version of the static-protective containerboard will give satisfactory performance in many applications. In this alternate embodiment the basic advantages of the more elaborate preferred form of the present invention are retained, namely, a continuous buried conductive medium 22 which provides full Faraday cage shielding, and static dissipative outer layers provided by the kraft liners which prevent potentially damaging electrostatic sparking by controlling the discharge rate of the conductive medium. Furthermore, the kraft liner coverings are free of impregnation with conductive particulate material and serve as a continuous barrier against sloughing of conductive particles or fibers from the corrugated medium 22 onto electronic devices, thereby ensuring against possible destructive short circuiting of protected electronic devices by such conductive debris. Even if partial cracking or breaking of the kraft liner coverings 28, 30 were to occur at fold lines of packaging made of the material, still no opening would be created for conductive material from the impregnated medium 22.

In the preferred form of the invention featuring the ink and varnish layers 34, 36, 38a,38b, the dissipative ink 34 provides a more uniform and closely controlled static discharge rate for the kraft liner coverings than is obtainable using the plain kraft liners. The static discharge rate is improved somewhat by the ink over the plain kraft liner for faster dissipation of accumulated charges yet without potentially harmful sparking. The varnish layer 38a,38b protects the ink layer against rubbing off from the kraft liner covering during handling and transport of packages made of the containerboard material, to prevent bare spots and irregularities in static-protective performance of the containerboard. In addition, the varnish layer 38a,38b helps limit the effect of changes in ambient relative humidity on the static dissipative properties of the kraft liner coverings 28, 30. The result of the combined benefits of the ink and varnish layers is that the kraft liner coverings 28, 30 remain static dissipative to very low levels of ambient relative humidity for safe packaging of electrostatically sensitive devices in very dry climates.

The following Examples 1 and 2 show results of testing conducted to establish the properties relevant to electrostatic protection and recyclability for the containerboard of this invention. Each test result includes a brief mention of the equipment used, where appropriate, and the methodology employed. Example 1 pertains to the full featured version of the containerboard including the dissipative outer coating of the kraft paper liners as described above. Example 2 corresponds to the economy version of the containerboard which is similar to that of Example 1 but without ink or varnish coating of the kraft paper liners. The weight per 1000 sq.ft. of the outer kraft liner-conductive medium-inner kraft liner of the containerboard tested in Examples 1 and 2 was 42 lbs.-30 lbs-42 lbs. respectively.

EXAMPLE 1

STATIC DECAY:

Average of 0.2–0.39 seconds@50% R.H. 71° F., Monroe Charge Plate Monitor 268A for 5 samples, Mil-B-81705; Fed-STD-101, Method 4046

SURFACE RESISTIVITY:

$2.9 \times 10^7$ ohms/square—$2.2 \times 10^{10}$ ohms/square@100 volts, Buried Shielding Layer of $<10^4$ ohms/square, Grounded Plane with Monroe 272A Model

RESISTANCE TO GROUND FOR CDM SAFETY:

$2.2-2.9 \times 10^8$ ohms/square@100 volts@71° F. 50% R.H. Grounded Plane, ROCKWELL INTERNATIONAL STANDARD, OCT. 1991

STATIC SHIELDING:

Integrity of 3M Sensor@62 volts for 1 kv, No Failures in 5 consecutive Test, 3M 753-ESD Simulator Unit & 3M Sensors, Meets EIA-541, appendix E, Capacitive Probe Test

RECYCLABILITY:

100% recyclability to recycling centers, Reference: Rockwell International Report 18 May 1993

CDM SAFETY:

Passed 3M Static Event Detector of 34 volts@1 kv, Rockwell International Method, Oct. 1991

CHEMICAL:

Reducible Sulphur 2 ppm, Nontarnishing to silver, solder & copper per Tappi T-406

EXAMPLE 2

STATIC DECAY:

Average of 0.2–0.3 seconds@50% R.H. 71° F., Monroe Charge Plate Monitor 268A for 5 samples, Mil-B-81705; Fed-STD-101, Method 4046

SURFACE RESISTIVITY:

$5.4 \times 10^9$ ohms/square—$1.3 \times 10^{10}$ ohms/square@100 volts, Buried Shielding Layer of $<10^4$ ohms/square, Grounded Plane with Monroe 272A Model

RESISTANCE TO GROUND FOR CDM SAFETY:

$2.2 \times 10^8$ ohms/square@100 volts@71° F. 50% R.H. Grounded Plane, ROCKWELL INTERNATIONAL STANDARD, OCT. 1991

STATIC SHIELDING:

Integrity of 3M Sensor@62 volts for 1 kv, No Failures in 5 consecutive Test, 3M 753-ESD Simulator Unit & 3M Sensors, Meets EIA-541, appendix E, Capacitive Probe Test

RECYCLABILITY:

100% recyclability to recycling centers, Reference: Rockwell International Report 18 May 1993

CDM SAFETY:

Passed 4.5 kv 3M Static Event Detector of 50 volts, Rockwell International Method, Oct. 1991

CHEMICAL:

Reducible Sulphur 2 ppm, Nontarnishing to silver, solder & copper per Tappi T-406

While certain preferred embodiments of the invention have been described and illustrated for purposes of clarity and example, it must be understood that many changes, substitutions, and modifications to the described embodiments will become obvious to those possessed of ordinary skill in the art without thereby departing from the scope and spirit of the present invention which is defined by the following claims.

What is claimed is:

1. Corrugated sheeting for enclosing electrostatically sensitive devices, said sheeting comprising:

an undulating sheet medium having opposite first and second sides presenting alternating fluting apexes, said medium being sufficiently impregnated with an electrically conductive material to impart to said medium an electrical resistivity equal or lesser than ten thousand ohms per square first and second plain kraft paper liner coverings adhered to said fluting apexes on said first and second opposite sides respectively.

2. The sheeting of claim 1 wherein said medium is impregnated with carbon.

3. The sheeting of claim 1 wherein said medium is a paper material containing no less than about 7.5 percent by weight of a powdered electrically conductive substance.

4. The sheeting of claim 1 wherein said medium is kraft paper having a carbon content of no less than about 7.5 percent.

5. The sheeting of claim 1 wherein said plain kraft paper liner has an electrical resistivity of between ten to the sixth power and ten to the eleventh power ohms at a relative humidity greater than ten percent.

6. The sheeting of claim 1 wherein said plain kraft paper liner has an electrical resistivity of between ten to the seventh power and ten to the tenth power ohms at a relative humidity greater than ten percent.

7. The sheeting of claim 1 wherein said plain kraft paper liner is characterized by a static charge drain rate from 5kVolt to 500 Volt of no more than approximately 2 seconds.

8. The sheeting of claim 1 wherein said plain kraft paper liners each have an outer surface facing away from said medium and said outer surface is coated with an electrically dissipative sealer.

9. The sheeting of claim 8 wherein said dissipative sealer is comprised of a varnish and a dissipative ink.

10. The sheeting of claim 9 wherein said varnish is a styrene acrylic polymer resin.

11. The sheeting of claim 9 wherein said dissipative ink has a metal content of about 1.5%.

12. The sheeting of claim 11 wherein said metal content is metallic copper.

13. The sheeting of claim 9 wherein wherein said dissipative ink comprises a first layer of dissipative ink having a metal content of about 1.5 percent and admixed with a carbon ink, and a second layer of dissipative ink similar to said first layer but without said carbon ink.

14. Recyclable corrugated sheeting for enclosing electrostatically sensitive devices, said sheeting comprising:
a carbon impregnated corrugated paper medium having an electrical resistivity equal to or lesser than ten thousand ohms per square; and
first and second kraft liner coverings adhered to opposite sides of said medium;
wherein said kraft liner has an electrical resistivity of between ten to the sixth power and ten to the eleventh power ohms at a relative humidity greater than ten percent.

15. The sheeting of claim 14 wherein said kraft liner is characterized by a static charge drain rate from 5 kilovolt to 500 Volt of no more than approximately 2 seconds at a relative humidity greater than ten percent.

16. The sheeting of claim 13 wherein said kraft liners each have an outer surface facing away from said medium and said outer surface is coated with an electrically dissipative layer.

17. The sheeting of claim 16 wherein said dissipative layer comprises an inner coating having a metallic content and an outer protective coating.

18. The sheeting of claim 17 wherein said protective coating comprises a styrene acrylic polymer resin.

19. Corrugated sheeting for enclosing electrostatically sensitive devices, said sheeting comprising:
an undulating sheet medium of paper material having opposite first and second sides presenting alternating fluting apexes, said paper material being impregnated with carbon to impart to said medium an electrical resistivity equal or lesser than ten thousand ohms per square;
first and second kraft liner coverings adhered to said fluting apexes on said first and second opposite sides respectively said kraft liners each having an outer surface facing away from said medium, said outer surface being coated with an electrostatically dissipative layer, the coated kraft liner being characterized by an electrical resistivity of between ten to the sixth power and ten to the eleventh power ohms and a static charge drain rate from 5 kilovolt to 500 Volt of no more than approximately 2 seconds.

20. The sheeting of claim 19 wherein said dissipative sealer is comprised of a base coating including an electrostatically dissipative ink and a covering layer of a protective varnish.

21. The sheeting of claim 20 wherein said varnish is a styrene acrylic polymer resin.

22. The sheeting of claim 20 wherein said dissipative ink contains finely granulated copper metal and carbon black.

23. Sheeting for use in packaging electrostatically sensitive devices, said sheeting comprising:

a carbon impregnated corrugated paper medium having an electrical resistivity equal to or lesser than ten thousand ohms per square; and
first and second kraft liner coverings adhered to opposite sides of said medium, each of said liners having outer surfaces coated with an electrostatically dissipative colored ink.

24. The sheeting of claim 23 wherein said ink is covered with a protective varnish.

25. The sheeting of claim 23 wherein the coated kraft liners are characterized by an electrical resistivity of between ten to the sixth power and ten to the eleventh power ohms.

26. A method for making recyclable sheeting for use in packaging electrostatically sensitive devices comprising the steps of:
providing a carbon impregnated corrugated medium in continuous roll form, said corrugated medium having an electrical resistivity lesser than ten thousand ohms per square;
providing kraft paper liner in continuous roll form;
preprinting one surface of said kraft paper liner with an electrostatically dissipative ink; and
applying in continuous roll form said kraft liner paper to each side of said medium by adhering an unprinted opposite surface of the kraft liner paper to the apexes of the corrugations of the medium.

27. The method of claim 26 wherein said preprinting comprises the step of applying a protective coating over said ink.

28. The method of claim 26 wherein said preprinting comprises printing said one surface first with a layer of said ink and then with one or more layers of protective varnish over said ink.

29. The method of claim 26 wherein said preprinting comprises applying one or more layers of said ink to said one surface and then applying one or more additional layers of styrene acrylic polymer varnish.

30. The method of claim 26 wherein said ink is colored blue.

31. A method for making recyclable sheeting for use in packaging electrostatically sensitive devices comprising the steps of:
providing a carbon impregnated corrugated medium in continuous roll form, said corrugated medium having an electrical resistivity lesser than ten thousand ohms per square;
providing kraft paper liner in continuous roll form;
printing one surface of said kraft paper liner first with one or more layers of an electrostatically dissipative ink and then with one or more layers of protective varnish over said ink, said layers being applied successively in a single pass of said kraft paper liner through a printing press; and
applying in continuous roll form said kraft liner paper to each side of said medium by adhering an unprinted opposite surface of the kraft liner paper to the apexes of the corrugations of the medium.

32. The method of claim 31 wherein said ink is a blue colored ink containing metallic copper and finely granulated carbon in admixture with a styrene acrylic polymer resin, and said protective varnish is also a styrene acrylic polymer resin.

33. Recyclable corrugated sheeting for enclosing electrostatically sensitive devices, said sheeting comprising:
a carbon impregnated corrugated paper medium having an electrical resistivity equal to or lesser than ten thousand ohms per square; and first and second kraft liner coverings adhered to opposite sides of said medium;

wherein said kraft liner is characterized by a static charge drain rate from 5 kilovolt to 500 Volt of no more than approximately 2 seconds at a relative humidity greater than ten percent.

* * * * *

UNITED STATES PATENT AND TRADEMARK OFFICE
CERTIFICATE OF CORRECTION

PATENT NO. : 5,637,377
DATED : June 10, 1997
INVENTOR(S) : Bob Vermillion

It is certified that error appears in the above-identified patent and that said Letters Patent is hereby corrected as shown below:

In Claim 16, Column 9, line 32, for the claim reference numeral "13", should read -- 14 --.

Signed and Sealed this

Twenty-sixth Day of August, 1997

Attest:

BRUCE LEHMAN

Attesting Officer

Commissioner of Patents and Trademarks